(12) United States Patent
Asano

(10) Patent No.: US 8,273,318 B2
(45) Date of Patent: Sep. 25, 2012

(54) SURFACE MODIFYING CARBON NANOTUBE MATERIAL, MANUFACTURING METHOD THEREFOR, ELECTRONIC COMPONENT AND ELECTRONIC DEVICE

(75) Inventor: Koji Asano, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 338 days.

(21) Appl. No.: 12/052,265

(22) Filed: Mar. 20, 2008

(65) Prior Publication Data
US 2008/0241047 A1    Oct. 2, 2008

(30) Foreign Application Priority Data
Mar. 28, 2007  (JP) .................................. 2007-83836

(51) Int. Cl.
*D01F 9/12* (2006.01)
*C23C 8/00* (2006.01)
*C23C 14/28* (2006.01)

(52) U.S. Cl. ..................... 423/447.1; 427/586; 427/595; 977/745; 977/847

(58) Field of Classification Search ............... 423/447.1, 423/447.2, 447.3, 461; 977/734–753, 842–884; 427/566–567, 574, 588, 595–597, 586
See application file for complete search history.

(56) References Cited

U.S. PATENT DOCUMENTS

| 7,084,507 B2 | 8/2006 | Awano |
| 7,731,928 B2 | 6/2010 | Duesberg et al. |
| 2002/0163079 A1 | 11/2002 | Awano |
| 2006/0210466 A1 | 9/2006 | Mitra et al. |
| 2006/0226551 A1 | 10/2006 | Awano |
| 2007/0248523 A1 * | 10/2007 | Duesberg et al. ............. 423/325 |

FOREIGN PATENT DOCUMENTS

| JP | 2000-516708 A | 12/2000 |
| JP | 2002-329723 A | 11/2002 |
| JP | 2005-200272 A | 7/2005 |
| KR | 1020050026580 A | 3/2005 |
| WO | 98/05920 A1 | 2/1998 |
| WO | 2005/118472 A1 | 12/2005 |
| WO | WO 2005/118472 A1 * | 12/2005 |

OTHER PUBLICATIONS

Fu, et al., Selective Coating of Single Wall Carbon Nanotubes with Thin SiO2 Layer, Nano Letters 2002; 2(4): 329-332.*
Mimura, et al., A New Photochemical Selective Silylation Technique for Resist Materials, Jpn. J. Appl. Phys. 1994; 33: 2789-2797.*
"Fujitsu Pioneers Use of Carbon Nanotubes for Heatsinks for Semiconductors," Fujitsu Limited;Tokyo, Dec. 5, 2005; 6 sheets of the document.
Mizuhisa Nihei et al; "Electrical Properties of Carbon Nanotube Bundles for Future Via Interconnects," Japanese Journal of Apppplied Physics; vol. 44; No. 4A; 2005; pp. 1626-1628.

(Continued)

*Primary Examiner* — Daniel C. McCracken

(74) *Attorney, Agent, or Firm* — Westerman, Hattori, Daniels & Adrian, LLP

(57) ABSTRACT

A carbon nanotube material is exposed to ultraviolet rays, and a silicon-containing compound capable of modifying the surface of the carbon nanotube material in combination with the ultraviolet rays is supplied to thereby modify the surface of the carbon nanotube material.

13 Claims, 6 Drawing Sheets

OTHER PUBLICATIONS

Mimura, Yoshiaki et al.; "A New Photochemical Selective Silylation Technique for Resist Materials"; Japanese Journal of Applied Physics, 1994, vol. 33, Part 1, No. 5, pp. 2789-2797.

Korean Office Action dated Feb. 3, 2010, issued in corresponding Korean Patent Application No. 10-2008-0027908.

Chinese Office Action dated May 18, 2010, issued in corresponding Chinese Patent Application No. 200810090317.3.

Korean Office Action dated Sep. 20, 2010, issued in corresponding Korean Patent Application No. 10-2008-0027908.

Asano Koji et al.; "Chemical Modification of Multiwalled Carbon Nanotubes by Vacuum Ultraviolet Irradiation Dry Process"; Japanese Journal of Applied Physics, Japan Society of Applied Physics, JP, vol. 45, No. 4B, Apr. 1, 2006, pp. 3573-3576, XP003021247.

European Search Report dated Aug. 17, 2011, issued in corresponding European Patent Application No. 08152545.3.(cited in European Search Report dated Aug. 17, 2011).

Ma, Peng Chen et al.; "Functionalization of carbon nanotubes using a silane coupling agent", Carbon, vol. 44, Aug. 22, 2006, pp. 3232-32378, XP55004267(cited in European Search Report dated Aug. 17, 2011).

* cited by examiner

PRIOR ART

PRIOR ART

US 8,273,318 B2

SURFACE MODIFYING CARBON NANOTUBE MATERIAL, MANUFACTURING METHOD THEREFOR, ELECTRONIC COMPONENT AND ELECTRONIC DEVICE

CROSS-REFERENCE TO RELATED APPLICATIONS

This application is based upon and claims the benefit of priority from the prior Japanese Patent Application No. 2007-83836, filed on Mar. 28, 2007, the entire contents of which are incorporated herein by reference.

BACKGROUND OF THE INVENTION

1. Field of the Invention

The present invention relates to a surface modification technique for a carbon nanotube material.

2. Description of the Related Art

In recent years, carbon nanotubes (CNTs) are being studied for electronic components with the properties of electrical conductors and thermal conductors in the field of semiconductor devices and semiconductor integrated circuit devices including printed wiring boards.

There is particular interest in CNTs as materials for forming semiconductor devices because of their excellent chemical stability, unique physical and electrical properties and other characteristics, and various researches are continuing into means of controlling their thickness and length, formation position, chirality and the like.

Specific applications of interest include electromagnetic shielding materials in electronics, cooling bump component materials for ultra-LSI and other advanced electronic devices, and structural components for the wiring vias of semiconductor devices (electronic devices) and the like.

For example, one application that is being considered to exploit the extremely good thermal conductivity of CNTs is to grow them at high densities on semiconductor process boards or to scatter previously-synthesized CNTs on boards to thereby form and mount CNT parts which can be used as adhesive structures for semiconductor devices (electronic devices) mounted on some electrically conductive circuits and process boards, and exhaust heat paths (so called "bump structures") for the device heat discharged by the adhesive structures.

Furthermore, the extremely good electrical conductivity of CNTs could make them useful for application to the via wiring structural body of the high-density wiring structures of semiconductor devices having ultrafine structures.

FIG. 5 shows one example of a structure (see for example the technical bulletin "Fujitsu Pioneers Use of Carbon Nanotubes for Heatsinks for Semiconductors", by Fujitsu Ltd., Fujitsu Laboratories Ltd. 5 Dec. 2005 that uses such CNTs as the cooling bump material of an advanced electronic device. As shown in FIG. 5, regarding the cooling bump structure for such an advanced electronic device, the CNT bump structure can be prepared for example by depositing a catalytic metal carrier film (such as a TiN film) and a catalytic metal film (Co or the like) (shown together as 53 in the drawing) by sputtering or the like on electrode 52 on substrate (aluminum nitride (AlN), alumina or the like) 51, then growing CNTs 54 by thermal CVD (chemical vapor deposition) using hydrocarbon gas ($CH_4$, $C_2H_2$ or the like), and then applying a conductive substance (Cu, Al or other metal or the like) to the CNT part of the board with CNTs by plating (wet processing) or the like. An electronic device can then be thermo-compression bonded (preferably at about 250 to 450° C.) on this board to prepare a highly thermally conductive electronic device.

FIG. 1 shows one example of a wiring via structure using the aforementioned CNTs (see for example Japanese Unexamined Patent Application Publication No. 2002-329723 (Claims) and Nihei et al., Japanese Journal of Applied Physics, 2005, Vol. 44, p. 1626). As shown in FIG. 1, such a via structure can be prepared for example by forming underlayer 2 and Cu wiring layer 3 on substrate 1, depositing barrier film (Ta film or the like) 4 on Cu wiring layer 3 to prevent scattering of the Cu, forming insulating layer 5 on top of that, making the via hole, and then depositing catalytic metal carrier film (Ti or the like) 6 and Co or other catalytic metal film (or catalytic fine particle layer) 7 by sputtering or the like, growing CNTs 8 by thermal CVD (chemical vapor deposition) or the like using hydrocarbon gas ($CH_4$, $C_2H_2$ or the like), and finally forming the upper wiring. FIG. 1 also shows filler resin 9 for fixing CNTs 8.

However, the problem is that although the CNTs themselves have excellent electrical conductivity, semiconductor properties, thermal conductivity, chemical stability and the like, they may not have sufficient affinity to the materials with which they come into contact, so that electrical and thermal conductivity may be greatly reduced at the connections and adequate adhesiveness and close contact between layers may not be obtained. This problem also occurs when nanotubes manufactured by CVD with one end fixed to a Si substrate are used for wiring purposes.

One potential solution would be to achieve perfect close contact between the CNTs and surrounding layers when manufacturing the component. The problem is, however, that such contact cannot be achieved without resolving the problem of poor affinity at the boundaries to the other materials. This problem is common to all applications of CNTs.

CNTs are conventionally manufactured by various manufacturing methods including laser ablation, chemical vapor deposition (CVD), the HiPCo (high-pressure carbon monoxide) method and the like. The surface properties of CNTs manufactured by these methods are dependent on the properties of the graphite-like surface molecular structure, which is an electronic hyperconjugated molecular structure of linked benzene rings, and are also graphite-like in terms of wettability with other materials. That is, the molecular surface after manufacture (as a powder for example) without any additional treatment normally has poor dispensability in any solvents, and even treatment under specific conditions (such as ultrasonic treatment in the presence of ethanol) can only provide a dispersed state for a few weeks at most.

As discussed before, this property has greatly restricted various engineering applications of CNTs. That is, when attempting to manufacture hybrid materials of manufactured CNTs with other materials, such as functional structural materials mixed with resins, it is currently difficult to manufacture a composite material with sufficient compatibility on the microscopic level by kneading or otherwise processing the CNTs with other materials without surfactants and other additives, and when additives are added, the properties of these materials inevitably have adverse effects on the composite material, resulting in, for example, poorer electrical properties, mechanical strength and chemical properties. Poorer electrical properties here mean, for example, increased specific resistance, decreased reliability of the electrical properties in the middle to long term, increased specific resistance relative to weight and poorer electromagnetic shielding performance, as well as poorer reliability in the performance. Poorer mechanical strength means decreased rigidity and breaking strength, as well as long-term deterioration of these properties and the like. Poorer chemical properties mean that the material properties involving the environment (such as hygroscopicity, solvent resistant, oxidation from oxygen in the air) deteriorate over time.

For example, in order to use CNTs as via wiring materials in ultra-LSI and other high-density advanced electronic devices, the tops of CNTs grown in a via must be shaved by CMP (chemical mechanical polishing). In this case, it may be necessary to fill or fix the area around the bundle of CNTs with an insulating material or the like in order to fix the bundle or prevent polishing material or liquid from infiltrating and contaminating the CNTs during CMP (or to make it easier to remove when it does infiltrate), but if the CNTs do not have a good affinity to the insulating material or the like, the insulating material may not completely fill the spaces between CNT bundles even if a resin dissolved in a solvent is applied by spin coating or the like, or even if a film is formed from the resin material in a vacuum environment.

SUMMARY OF THE INVENTION

According to an aspect of an embodiment, there is a method for manufacturing a surface modified carbon nanotube material which includes modifying the surface of a carbon nanotube material by exposing a carbon nanotube material to ultraviolet rays and supplying a silicon-containing compound capable of modifying the surface of the carbon nanotube material in combination with the ultraviolet rays.

According to another aspect of an embodiment, there is a surface modified carbon nanotube material the surface of which is modified with at least one of a silicon-containing group and a silicon-containing compound.

According to still another aspect of an embodiment, there is an electronic component having any of the aforementioned surface modified carbon nanotube materials and an electronic device having any of the aforementioned surface modified carbon nanotube materials.

DESCRIPTION OF THE PREFERRED EMBODIMENTS

Figure 1:
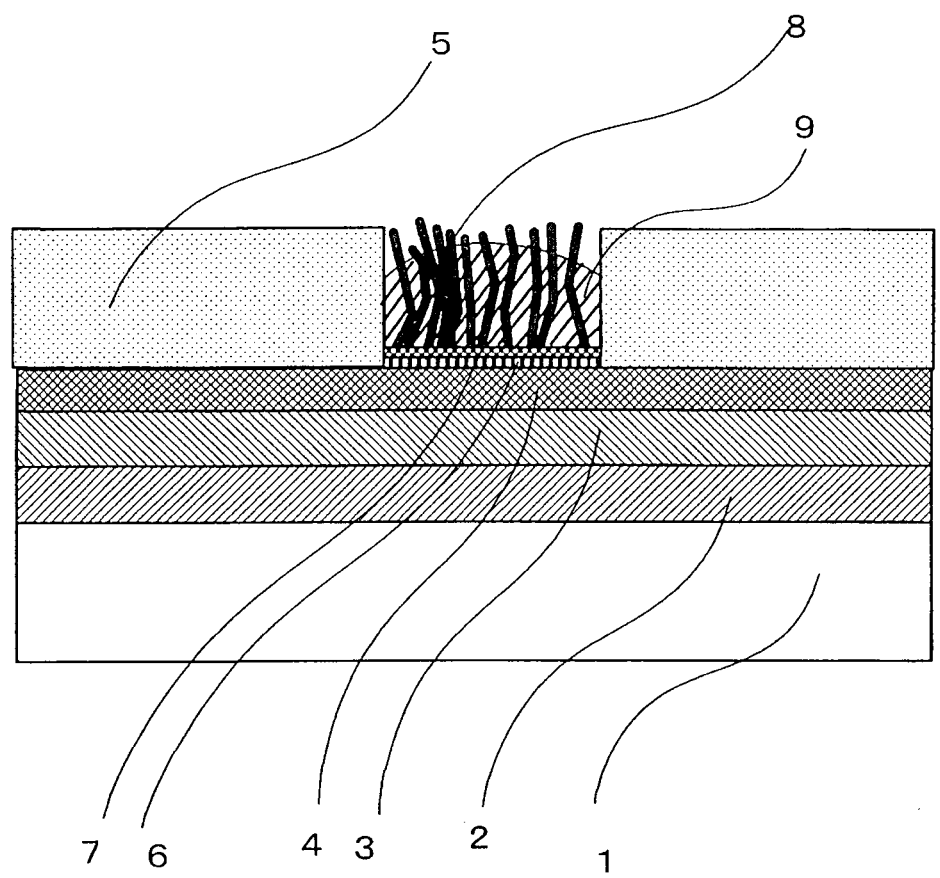
FIG. 1 is a model horizontal cross-section of a wiring via structure using CNTs.

Embodiments of the present invention are explained below using drawings, examples and the like. These figures, examples and explanations are examples of the present invention and do not limit the scope of the present invention. Other embodiments can of course be included in the scope of the present invention as long as they are consistent with its intent.

The surface modified carbon nanotube material of one embodiment can be manufacturing by a method that comprises exposing a CNT material to ultraviolet rays and supplying a silicon-containing compound capable of modifying the surface of the CNT material in combination with the ultraviolet rays (a silicon-containing compound capable of modifying the surface of a CNT material in combination with ultraviolet rays is called a specific substance, hereinbelow) to thereby surface modify the carbon nanotube material.

A novel CNT material with improved affinity in contact with another material is obtained by means of one or more embodiments. As a result, the problems of a large decrease in electrical and thermal conductivity at the connections with another material and insufficient adhesiveness and close contact between layers can be controlled. Such a material can be used favorably in an electronic machine, electronic component or the like.

The reason why the surface of the CNT material can be modified by exposing it to ultraviolet rays and supplying a specific substance is probably that the substance is activated by the ultraviolet rays and generates chemically active species such as radicals which affect the surface of the CNT material.

This mechanism is presumed to be as follows for example (however, the validity of this presumption has no bearing on the essence). That is, exposure to ultraviolet rays breaks the bonds of a specific substance that is in a floating state near the nanotube molecules, generating various radicals and other chemical species containing silicon. Amino radicals, alkyl radicals, alkoxy radicals and other chemical species containing silicon may be generated. Because these radicals and the like are unstable and highly reactive, they rapidly bind to the relatively reactive defect sites (5-member rings, 7-member rings, sites of unstable bonding normally called dangling bonds, etc.) on the adjacent graphene sheet of nanotubes, forming covalent bonds. In this way, the surface of the CNT material is modified with silicon-containing groups. Another possible mechanism is one whereby the chemically active species such as radicals, rather than forming direct chemical bonds with the nanotubes, react and re-bind with each other, forming products with higher boiling points (low volatility), and these silicon-containing compounds are adsorbed on the surface of the CNT material, thereby modifying the surface of the CNT material with silicon-containing compounds.

However, other mechanisms are also conceivable, such as one for example whereby this substance or part of it is adsorbed on the surface of the CNT material and acts on the surface of the CNT material due to the effect of the ultraviolet rays without involving any radicals or other chemically active species. Moreover, chemical bonds are probably the principal actors in the aforementioned effects, but physical adsorption or the like may also be involved. The mechanisms and modes of action leading to modification have no bearing on the essence.

Taken as a whole, the above can be taken to mean that the CNT material is preferably surface modified by at least one of a silicon-containing group and a silicon-containing compound.

Whether or not the surface has been modified by at least one of a silicon-containing group and a silicon-containing compound can be verified by confirming the presence of silicon atoms on the surface of the surface modified CNT material. Alternatively, it can be verified by confirming the presence of silicon-carbon bonds on the surface of the surface modified CNT material. These silicon atoms or silicon-carbon bonds are preferably ones that are not greatly reduced or eliminated by surface washing with a solvent. Their presence can be confirmed by any method, and for example silicon-carbon bonds can be easily confirmed from the XPS (x-ray photoelectron spectrum), the IR (infrared absorption) spectrum or the like.

A silicon-containing compound can be confirmed to be a specific substance for the surface modified carbon nanotube material if the surface of the CNT material is modified in some sense after exposure to ultraviolet rays. When the CNT material is surface modified after contact with a substance even without ultraviolet rays, it can be confirmed to be a specific substance if the degree of surface modification is greater with exposure.

Specifically, such surface modification can be confirmed if the surface of the CNT material has been modified in some sense by changes in surface tension, changes in wettability with a specific solvent, introduction of a specific group or groups (such as a polar group or groups) on the surface of the CNT material, changes in adhesiveness with a specific material, changes in absorbed amount of a specific substance or the like, or has been modified more than it would have been without ultraviolet exposure. Affinity to another substance is improved as a result of such modification.

Alternatively, as described above, since most substances capable of generating chemically active species such as radicals when exposed to ultraviolet are specific substances, a silicon-containing compound capable of generating chemically active species such as radicals when exposed to ultraviolet can be considered a specific substance regardless of the specific changes mentioned above. This is because if chemically active species such as radicals are generated, there should logically be some sort of change in the surface of the CNT material.

It may be desirable that such chemically active species such as radicals include at least either chemically active species such as an electron donating group radical or chemically active species such as an electron attracting group radical. When such chemically active species such as radicals are involved, affinity to substances having polarity is improved through introduction of a polar group into the CNT material.

Regarding the surface modified carbon nanotube material, a "surface" is a surface for purposes of surface modification, and may include not only the outer surface of the CNT material but also indentations and inner surfaces, but in the context of the present invention it is not important what specific part of the CNT material is modified.

The specific substance for the surface modified carbon nanotube material is not particularly limited as long as it is a silicon-containing compound capable of modifying the surface of a CNT material in combination with ultraviolet rays, and it may be selected from any silicon-containing compounds. Specifically, it is preferably selected according to the type of surface modification desired. Affinity to silicon containing compounds in general can be improved by using a silicon-containing compound, but for purposes of improving affinity to a polar solvent for example, the specific substance is preferably a substance capable of introducing a polar group on the surface of the CNT material. For purposes of improving affinity to a solvent having a specific structure, the specific substance is preferably a substance capable of introducing that specific chemical structure or a similar chemical structure on the surface of the CNT material.

Examples of this specific substance include silanes, disilanes, silane halides, aminosilanes, alkylsilanes and derivatives of these.

More specific examples include triisopropylsilane, triisopropylsilyl chloride, triisopropylsilyl acrylate, allyltrimethylsilane, trimethylsilyl methyl acetate, vinyltrimethoxysilane, allyltrichlorosilane, 3-aminopropyltrimethoxysilane, 3-aminopropyl diethoxymethylsilane, 3-chloropropyl dimethoxymethylsilane, triethoxy-1H,1H,2H,2H, tridecafluoro-n-octylsilane, and isomers and derivatives of these.

The specific substance is supplied in order to bring it in contact with the CNT material. It is supplied in a gaseous phase. When the specific substance is supplied as vapor, it may be desirable to use reduced pressure as discussed below because vapor pressure is low and vapor may be difficult to generate at normal pressure and room temperature, to include an inactive substance that does not modify the surface of the CNT material even under ultraviolet exposure by diluting the specific substance with this inactive substance as discussed below, or to heat the specific substance. In other words, this means that when the specific substance is supplied as vapor, it is desirable for the specific substance to have a certain vapor pressure at the temperature used. The aforementioned silanes, disilanes, silane halides, aminosilanes, alkylsilanes and derivatives thereof are often desirable from this standpoint.

However, the specific substance does not necessarily need to be in the form of vapor. Consequently, it may be useful in some cases to supply the specific substance in a state of suspension formed by spraying it in another gas. In this case, the suspended specific substance may contribute to modifying the CNT material while still in a liquid state.

When the aim is also to confer other affinities such as affinity to a polar solvent, it is desirable to include a substance capable of introducing polar groups or other groups that can confer such affinity onto the CNT material surface. More specifically, it is desirable to supply the specific substance together with at least one substance selected from hydrocarbons, oxygen, amines, alkyl halides, alcohols, ethers and mixtures of these.

In this way, singlet oxygen and other types of active oxygen, amino radicals, alkyl radicals, alkoxy radicals and other chemical species are generated. Because these radicals are also unstable and highly reactive, they rapidly bind to the relatively reactive defect sites (5-member rings, 7-member rings, sites of unstable bonding normally called dangling bonds, etc.) on the adjacent graphene sheet of nanotubes, forming covalent bonds. Or else the chemically active species such as radicals, rather than forming direct chemical bonds with the nanotubes, react and re-bind with each other, forming products with higher boiling points (low volatility) that are adsorbed on the surface of the nanotube molecules. As a result, not only can affinity to silicon-containing compounds be improved, but so can affinities to electrically conductive substances, insulating substances, hydrophilic substances, lipophilic substances and substances having specific groups and the like.

Examples of oxygen, amines, alkyl halides, alcohols, ethers and mixtures of these include triethylamine, n-butyl chloride, isobutyl chloride, n-butyl bromide, isobutyl bromide, ethanol, 2-propanol (isopropyl alcohol), acetone, diethyl ether, dichloroethane, n-hexane, cyclohexane, n-hexanone, cyclohexanone, benzene, xylene, methyl ethyl ketone (MEK), DMF (dimethyl formamide), DMSO (dimethyl sulfoxide), dimethyl acetamide, diethyl ketone, methyl isobutyl ketone (MIBK), n-methylpyrrolidine, dichloroethane and pyridine.

Ultraviolet radiation can be classified into UV-A with a wavelength in the range of over 315 nm to 400 nm, UV-B with a wavelength of over 280 nm to 315 nm, UV-C with a wavelength of over 200 nm to 280 nm and vacuum ultraviolet (VUV) with a wavelength in the range of 10 to 200 nm, and the ultraviolet for the surface modified carbon nanotube material can be selected appropriately from these ranges. However, because the surface of a CNT material is normally highly stable (in chemical stability, etc.), it often cannot be modified sufficiently by exposure to UV-A, UV-B or UV-C. In this case, VUV is preferred.

The means of obtaining VUV is not particularly limited. A preferred example is a Xe excimer UV lamp with a narrow width and a central wavelength of 172 nm. A Xe-filled excimer lamp UV with a wavelength distribution of about 160 to 200 nm is normally desirable but is not necessarily required. The compound bond-cleaving energy is directly related to the wavelength of the VUV or other ultraviolet rays, and when there are specific bonds that should not be cleaved, it is useful to narrowly restrict the wavelength range of the VUV or other ultraviolet rays according to the object.

The VUV output is not particularly limited, either, and a commercially available output of tens of mW/cm$^2$ can be used advantageously. However, if there are no problems with cooling and installing the equipment for generating VUV (excimer UV lamp or the like), productivity can be improved by using a higher output machine or arraying multiple UV lamps near each other to thereby increase the exposure per unit area.

As its name suggests, VUV is normally used in a vacuum or under reduced pressure, but this is not necessarily the case, and normal pressure is also an option. That is, the CNT material can be exposed to VUV while in atmosphere at normal pressure or reduced pressure.

From the practical standpoint of controlling the combined effect of the ultraviolet and specific substance and allowing a larger distance between the ultraviolet and CNT material, it is often useful to control the concentration of the specific substance in the atmosphere surrounding the CNT material. This is especially important in the case of VUV. For example, specific substances often have large absorption coefficients, as shown by the fact that almost all VUV is absorbed within 1 cm in air containing 20 vol % oxygen, so it is often desirable to reduce the concentration (or the vapor pressure or partial pressure) of the specific substance by some means. This can be achieved by adjusting the degree of vacuum of the atmosphere, but it is usually desirable to also use a specific substance diluted with an inactive substance that is a substance that does not modify the surface of the CNT material even when exposed to VUV. Specifically, the specific substance is diluted to preferably between 0.001 and 50 vol % or more preferably between 0.01 and 10 vol % at normal pressure. This inactive substance is not particularly limited, but since the atmosphere is gaseous, a gaseous or volatile substance is normally suitable. Examples include neon, argon and other inactive gasses and nitrogen gas.

The distance between the CNT material being exposed and the ultraviolet source should usually be as small as possible to facilitate absorption of the ultraviolet. This is particularly important in the case of VUV. Depending on the types and concentrations (or on the vapor pressure or partial pressure) of substances between the CNT material and the VUV source, this distance is generally preferably 0.1 to 100 mm for example. In most cases, it should often be between about 0.2 mm and a few cm.

The method of ultraviolet exposure is not particularly limited. It does not necessarily need to occur at the same time that the specific substance is supplied. Examples include a method of supplying a specific substance continuously to a CNT material while also exposing it continuously to UV rays, a method of supplying a specific substance intermittently to a CNT material and exposing it intermittently to UV in conjunction with this supply, and a method of supplying a specific substance intermittently to a CNT material and exposing it to UV intermittently in conjunction with the supply and continuously for a certain period of time thereafter.

It is unknown whether only those areas that are directly exposed to UV rays undergo surface modification of the CNT material. When the resulting chemically active species such as radicals are long-lived for example, it is possible that even areas that have not been directly exposed to UV rays may undergo surface modification. Consequently, it is satisfactory if the CNT material is surface modified as a result of UV exposure of the material as a whole, but normally it is desirable that each individual CNT material be directly exposed to UV rays as much as possible. In this sense, it is desirable that the CNT materials be all aligned in the same direction extending vertically from the substrate, or that they be scattered on a substrate, but these are not limitations.

The aforementioned process can be applied with part of the CNT material surface covered using a conventional lithography technique or the like to thereby limit the areas of the surface to be modified, and this technique can also be applied multiple times so that different areas are modified in different ways. This is useful when different areas on a substrate are to be treated in different ways when preparing a bump for example.

A "CNT material" for the surface modified carbon nanotube material signifies a CNT or a material produced by modifying a CNT in some way. Typically, it is a CNT which is a carbon nanotube having a nanometer-sized cross-section (for example, a cross-sectional diameter of 0.3 to 10 nm). The length thereof is not particularly limited but can preferably be tens of nanometers to a few millimeters.

CNTs include those that assume a band structure fulfilling the conditions for exhibiting metallic properties, and those that assume a band structure fulfilling the conditions for exhibiting semiconductor (semi-metallic) properties. Either a CNT exhibiting metallic properties or a CNT exhibiting semiconductor properties may be used for the surface modified carbon nanotube material.

A "CNT material" for the surface modified carbon nanotube material may be a nanotube having a so-called peapod structure wherein a nano-structure other than a nanotube that exhibits metallic properties overall, such as a metal-containing fullerene, is packed inside a CNT. In other words, the "modification" described above includes such cases.

By using such a peapod nanotube containing another nano-structure, it may be possible to increase the electrical conduction characteristics or mechanical strength of a via for example. For example, when the CNTs contain metal-containing fullerenes, it is known based on the first-principle calculations that the charge of the metal inside will appear outside the fullerenes and further outside the nanotubes, thereby improving the electrical conduction characteristics of the via.

Rather than being contained within a nanotube, a molecule or atom or a structure other than a nanotube which exhibits metallic properties overall, such as a metal-containing fullerene, can also be present between adjacent nanotubes making up a single via. Such molecules or atoms or structures other than nanotubes can also be arranged between adjacent nanotubes that themselves contain metal fullerenes. A CNT that has been modified in this way is also a "CNT material" for the surface modified carbon nanotube material.

CNTs and other CNT materials have conventionally been formed by arc discharge or laser ablation, but currently plasma CVD (chemical vapor deposition) or thermal CVD is often used. Since the nanotubes can be formed directly on a substrate in CVD, this method offers potential for application to the manufacture of integrated circuits. Of course, the present invention is not limited by the method of manufacturing the CNTs used.

It is often desirable that the CNT material be prepared by CVD. In this case, the CNT material is produced on a substrate. Production of the CNT material on a substrate is not itself an essential condition, but it is often desirable for the CNT material to be produced on a substrate because this facilitates direct exposure to UV rays and provides close contact with the substrate as explained above.

When preparing the CNT material by CVD, the material forming the substrate is not particularly limited and can be selected appropriately from known materials, but it is desirable to use an electrically conductive material when electrical conductivity is desired and a thermally conductive material when thermal conductivity is desired.

Figure 2:
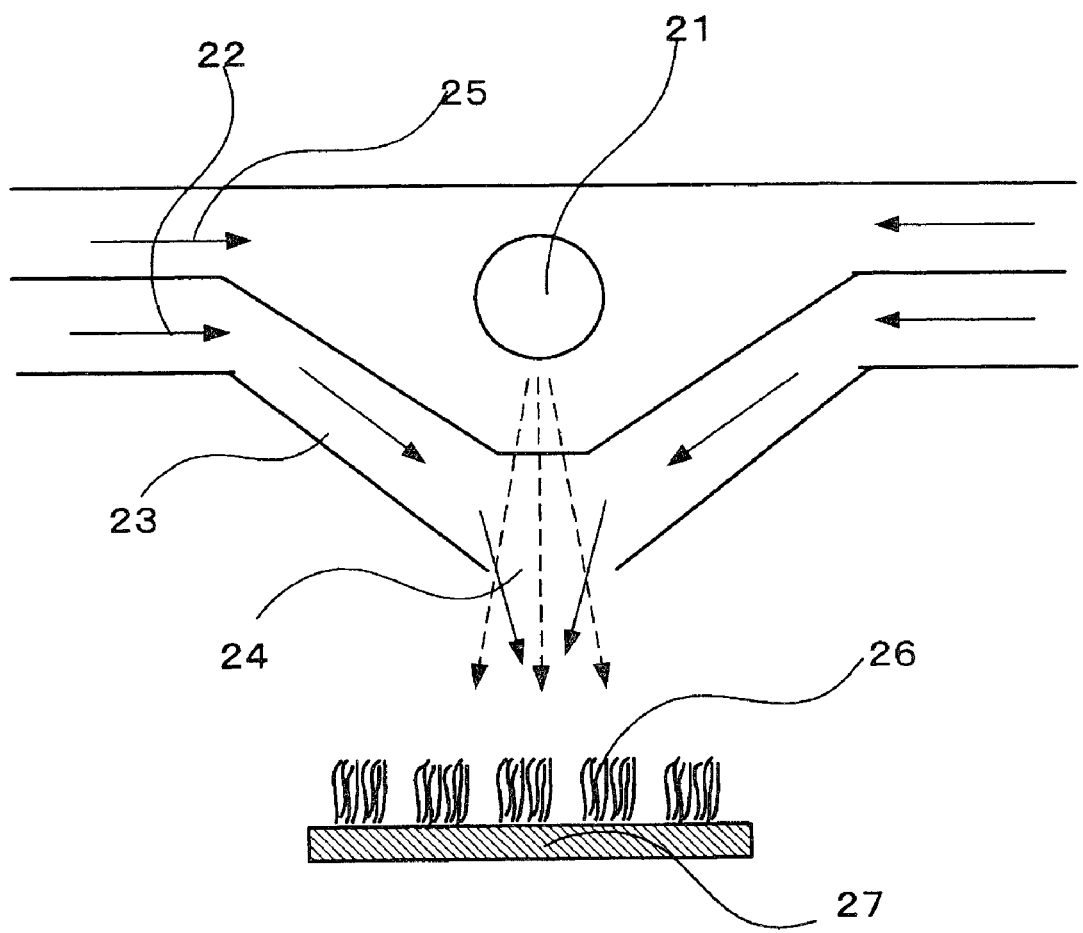
FIG. 2 is a model diagram showing the principal parts of a unit of one embodiment for exposing to VUV and supplying a specific substance.
Figure 3:
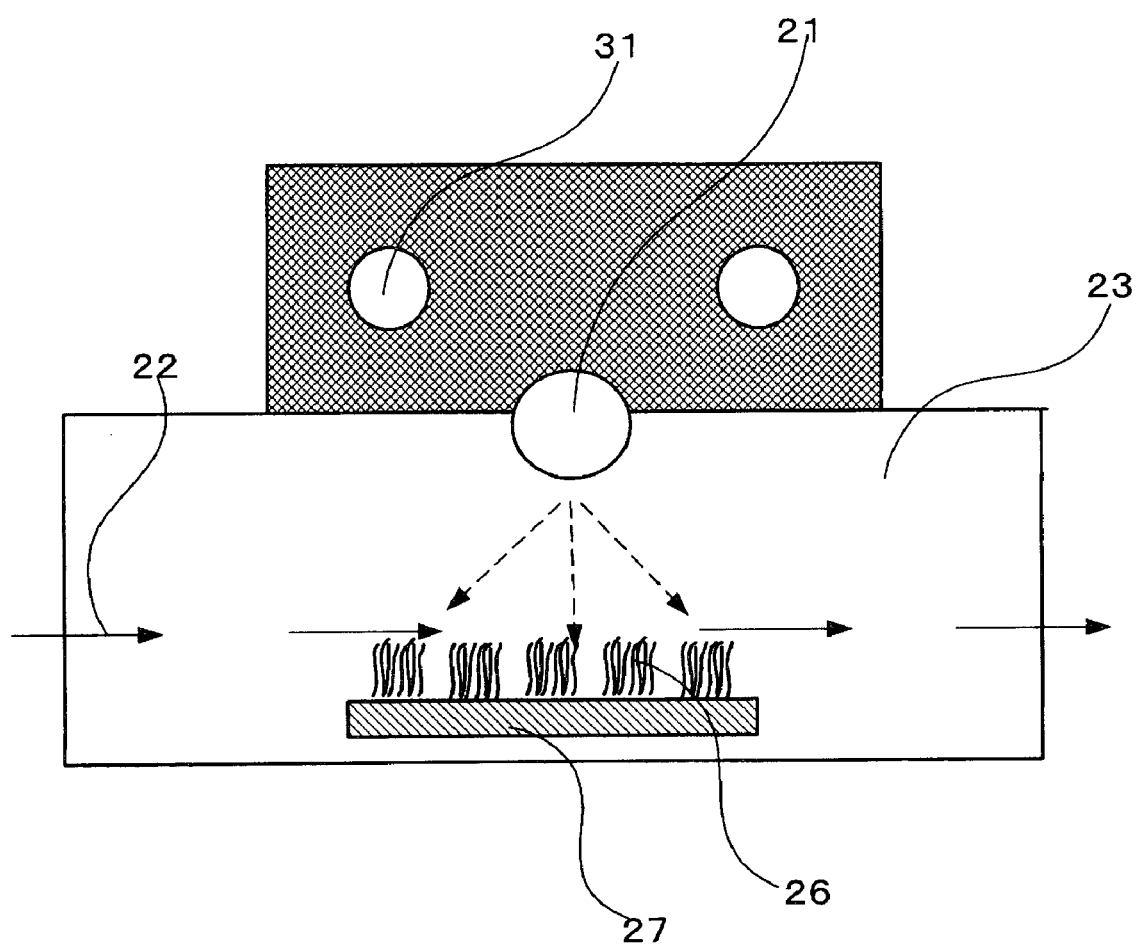
FIG. 3 is another model diagram showing the principal parts of a unit of one embodiment for exposing to VUV and supplying a specific substance.

There are no particular limitations on the equipment for exposing the CNT material to UV rays and supplying the specific substance. Examples include equipment having the structures shown in FIGS. 2 and 3. In FIG. 2, specific substance blower port 24 and supply conduit 23 for gas 22, which consists of a specific substance diluted with an inactive substance, are located below UV ray source 21. UV ray source 21 is cooled by cooling medium 25. Below blower port 24, substrate 27 having bundles 26 of vertically aligned CNTs moves from left to right as shown in the drawing. FIG. 3 is similar to FIG. 2 except that the cooling medium is replaced with water-cooling duct 31, and substrate 27 moves through supply conduit 23 for gas 22, which consists of a specific substance diluted with an inactive substance. The bundles 26 of vertically aligned CNTs can be realized for example as bundles of CNTs growing in via holes. The solid arrows in FIGS. 2 and 3 indicate the flow of cooling medium 25 and gas 22, which consists of a specific substance diluted with an inactive substance, while the broken arrows indicate UV rays.

The surface modified CNT material has better affinity than before modification when in contact with another substance. This "better affinity" may mean improved surface tension, improved wettability, improved adhesiveness or greater adsorptive capacity when in contact with another substance, less foreign matter (moisture, etc.) or fewer cavities (microscopic spaces) intervening between it and the other substance, or the like.

A primary example of the "other substance" in this case is a silicon-containing substance. That is, the surface modified CNT material has better affinity to a silicon-containing substance than before surface modification. The "silicon containing substance" here is not particularly limited. A suitable specific substance can be selected for the "silicon containing substance" to which the CNT material surface is to have more affinity, and the present embodiments can be applied effectively if the affinity to the "silicon-containing substance" is found to have improved as a result of the treatment of the present embodiments. In general, good affinity is easier to achieve when there are more similarities between the chemical structures of the "silicon-containing substance" and the specific substance.

The "other substance" in this case may also be at least one substance selected from the group consisting of the electrically conductive substances, insulating substances, hydrophilic substances, lipophilic substances and substances having specific groups. The object here is to improve electrical connectivity, thermal connectivity and/or mechanical bonding with other members and/or wettability with solvents, adhesives and/or the like when the CNT material is used as a component of an electronic device or the like, and to thereby avoiding peeling, circuit breakage and other problems during long-term use. It may also be a silicon containing substance which is also at least one substance selected from the group consisting of the electrically conductive substances, insulating substances, hydrophilic substances, lipophilic substances and substances having specific groups. In this case, better effects can often be achieved because the various kinds of affinity act together. Throughout the descriptions of this invention and the Specifications, the term "specific" in "specific group", "specific substance", "specific structure", "specific solvent", "specific bond", "specific material" and the like signifies not that these have been specifically determined but that they can be determined at will according to practical considerations.

Of the aforementioned silicon-containing substances, examples of insulating substances include SOG, TEOS (tetraethoxysilane), and so called "Low-k resins" with or without micropores, which are insulating materials used in insulating films such as interlayer insulating films for semiconductor devices and which also contain silicon.

Examples of electrically conductive substances in this case include copper, aluminum, and other metals and electrically conductive substances in general that are used for electronic wiring parts; examples of insulating substances include SOG, TEOS (tetraethoxysilane), polyimide resins and any other insulating resins for semiconductor seals, or the currently popular "Low-k resins", which have low dielectric constants and may or may not have micropores, or PFA, FEP, Teflon™ and other fluorine resins and other electrically insulating materials in general that are suitable for fixing CNTs; examples of hydrophilic substances include water, ethanol, methanol, phenol, dioxanes, ethylene glycol, diethylene glycol, triethylene glycol, glycerin and other alcohol solvents and the like; and examples of lipophilic substances include petroleum ether, n-hexane, cyclohexane and other paraffin solvents, benzene, toluene, xylene, cresol and other aromatic solvents, or THF (tetrahydrofuran), 2H-Pyran (pyran), 1,4-dioxane, DMF (dimethylformamide), DMSO (dimethylsulfoxide), dimethylacetamide or diethyl ketone, MIBK (methyl isobutyl ketone) and other ketones, n-methylpyrrolidone, dichloroethane, pyridine and other polar solvents containing hetero elements (elements other than C, O and H). Substances having specific groups may basically be any substances (preferably low-viscosity gases or liquids) having functional groups which are mostly included in the aforementioned insulating substances, hydrophilic substances and lipophilic substances, and the following are some typical examples: substances having at least one of —OH, —COOH, —NH$_2$, —NR$_2$ (wherein R is an aliphatic or aromatic alkyl group or derivative thereof), —CO—, —C=O, an imide bond and an ether bond, or in other words alcohols, phenols, carboxylic acids, amines, ketones, quinones and the like.

The terms silicon-containing substance, electrically conductive substance, insulating substance, hydrophilic substance, lipophilic substance and substance having a specific group may in some cases refer to the same substance.

The CNT material may as necessary be used for any application for which CNT materials are or could be used, such as electrical products, electronics, machines and the like, but the superior electrical and thermal characteristics of CNT materials make them particularly suited for aerospace and medical applications in which electromagnetic waves may be generated, or portable electronic instruments (including portable phones, personal computers and other portable electronic terminals), or electronic components and devices (such as semiconductor integrated circuit devices including semiconductor devices and printed wiring boards). They are also expected to provide long-term durable, high-performance, electrically conductive members (sheets, etc.) for electronic devices, and electromagnetic shielding members (sheets, etc.) with little degradation, as well as electronic components and devices that are resistant to problems such as peeling and circuit breakage. Examples of such electronic components include heat dissipation bumps for electronic device assembly, multilayer wiring for semiconductor devices (electronic devices), wiring vias for semiconductor devices (electronic devices) and the like.

In addition, the surface modified carbon nanotube material is also applicable not only to the aforementioned electronic components, electronic device elements and the like, but also for example to (flat or curved) aerospace applications and medical instruments which require high electrical and thermal conductivity relative to weight, as well as to portable phones, personal computers, other electronics that generate electromagnetic waves, electrically conductive sheets, high-frequency electromagnetic shielding materials for electronic terminals, and precursors (so-called prepregs) for preparing these components.

Figure 4:
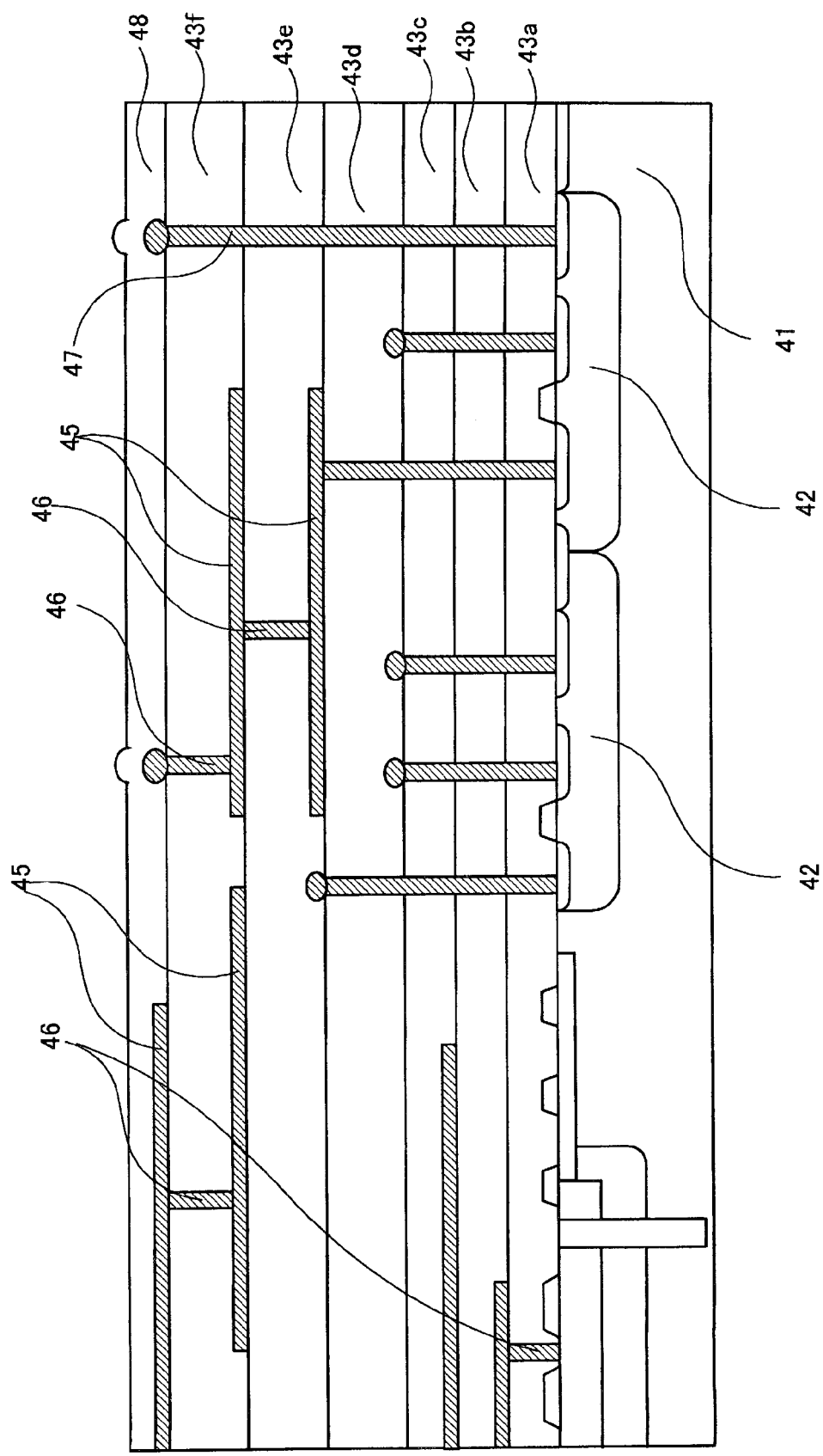
FIG. 4 is a model cross-sectional view showing a semiconductor integrated circuit device using a CNT material of one embodiment as the vias.

FIG. 4 shows a model cross-section of a semiconductor integrated circuit device in which the CNT material of one embodiment is used for the LSI wiring vias. In FIG. 4, multiple transistors 42 and other elements are packed into silicon substrate 41, with multiple insulating layers (interlayer insulating films) 43a through 43f formed over them. The insulating layers are interspersed with wiring layers, and certain wires 45 of the wiring layers are connected to the wires 45 of other layers by vias 46, which are formed passing through the insulating layers. 47 represents a contact that connects to wires 45 connecting elements to each other. The topmost wiring layer is covered by protective layer 48. In the integrated circuit device shown in this drawing, the CNT material is applied to vias 46, and by improving the wettability of these nanotubes for a specific solvent, it is possible to improve the infiltration of the dissolved SOG or other insulating resin around the CNTs, thereby preventing holes around the CNTs and fixing the CNT bundles so that the tops of the CNT material grown in the via can be properly shaved by CMP to thereby achieve a good electrical connection with the wiring part.

Figure 5:
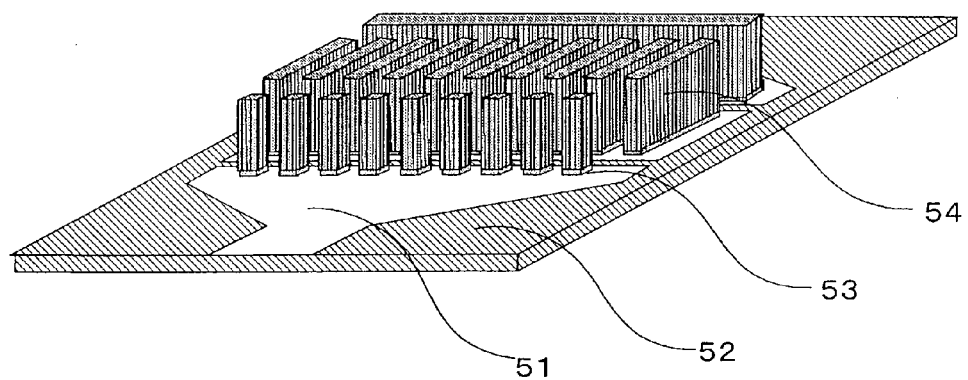
FIG. 5 schematically shows an example of an outline of the structure of an electronic device comprising a highly thermally conductive bump wherein a CNT material is applied to the cooling bump material of an advanced electronic device.

FIG. 5 is a diagram showing an outline of the structure of an electronic device comprising a high-temperature conduction bump, wherein a CNT material is used as the cooling bump material of an advanced electronic device, and in this case the CNT material can be applied as the cooling bump material of the advanced electronic device. For example, the substrate with CNTs of FIG. 5 can be treated with VUV in the presence of a gas consisting of oxygen diluted with nitrogen or oxygen and a small amount of water diluted with nitrogen, and the CNT part of this treated substrate with CNTs can then be plated (wet treated) to prepare a so-called CNT hybrid bump structure having a thermally and electrically conductive substance (metal such as Cu or Al, or the like) thoroughly penetrating the gaps between the CNT chains. Next, an electronic device can be thermocompression bonded (preferably at about 250 to 450° C.) to this treated substrate to prepare a highly thermally conductive electronic device using a CNT bump thoroughly permeated by a metal or the like.

Figure 6:
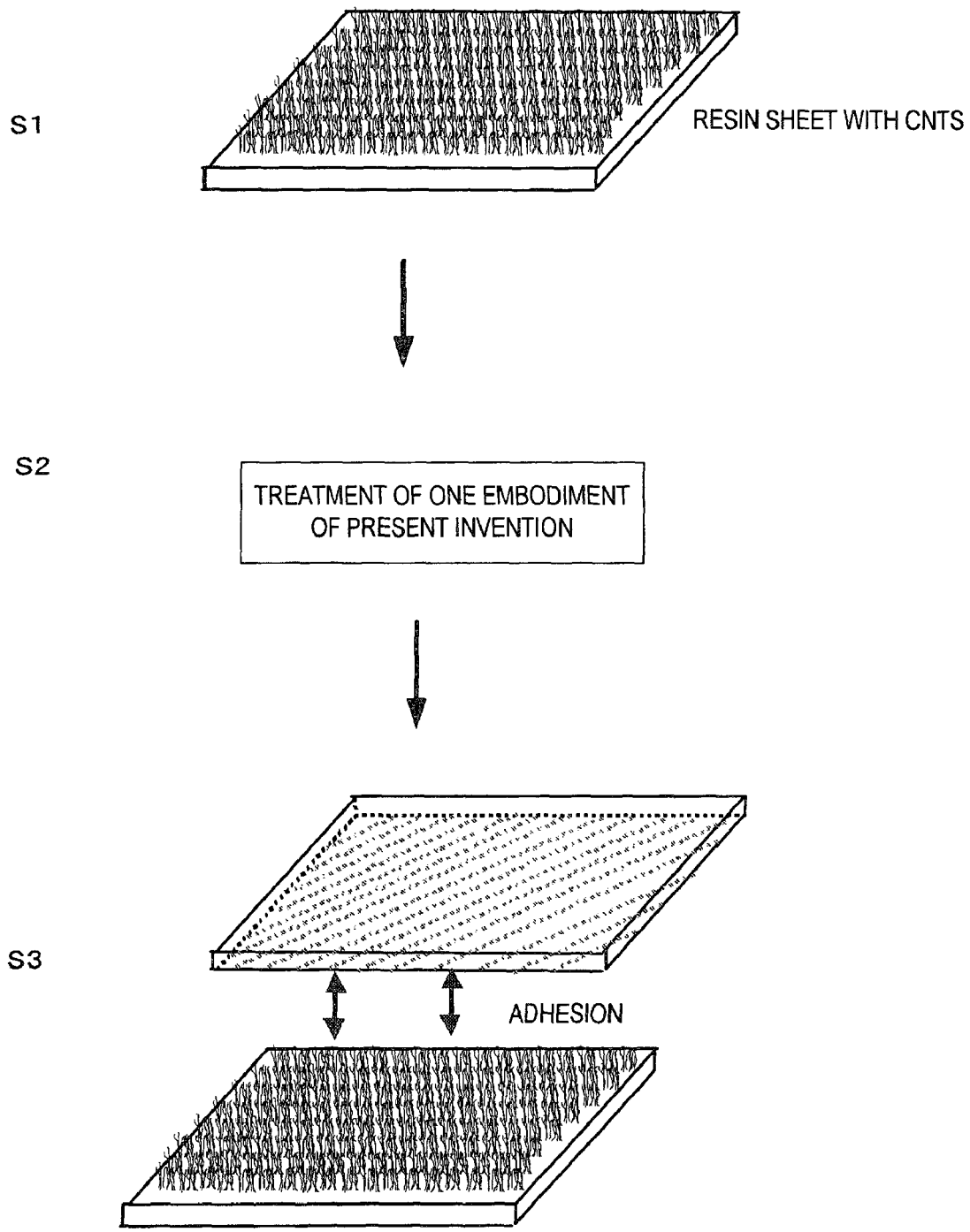
FIG. 6 schematically shows an outline of a preparation method in which the CNT material of one embodiment is applied to an advanced electromagnetic shielding material.

FIG. 6 is a diagram showing an electromagnetic shielding sheet or prepreg of one embodiment. That is, an electromagnetic shielding sheet or prepreg thereof can be obtained by scattering CNTs on a resin sheet and pasting that sheet to another resin sheet.

Based on the explanation above, a surface modified CNT material the surface of which has been modified with at least one of a silicon-containing group and a silicon-containing compound can be considered to have similar effects as the surface modified CNT materials of the aforementioned embodiments of the invention regardless of the method used. More specifically, affinity in contact with a silicon-containing substance can be made better than that before modification. Affinity in contact with at least one substance selected from the group consisting of the electrically conductive substances, insulating substances, hydrophilic substances, lipophilic substances and substances having specific groups can also be made better than that before modification. Such a surface modified CNT material can also be applied favorably to electronic components, particularly wiring vias, electronic device heat diffusion bumps, electrically conductive sheets, electromagnetic shielding sheets and/or prepregs for manufacturing electromagnetic shielding sheets, thereby providing electronic devices with improved reliability.

For example, when SOG is permeated in the via structure by SOG coating while preparing a via wiring structure formed from the surface modified CNT composite material of one embodiment in the process of manufacturing a semiconductor (electronic device), surface modification of the CNT via part by a method of an embodiment allows SOG permeation to be greatly improved and the mechanical strength of the CNT via structure to be greatly enhanced in cases in which permeation would normally be poor because of poor affinity between the CNTs and the resin, solvent and the like. In this way, the structure of this part is strong enough to withstand future CMP processing and other processes, improving process stability and manufacturing condition tolerances and improving the reliability of the finished product and the like. That is, affinity to many silicon-containing substances can be improved by means of the substances, process conditions and the like used in a chemical processing of various embodiments.

A prepreg of a composite material containing CNTs can also be made to have more affinity to foreign materials in the same way. In the case of a CNT composite (such as CNT+Cu) in which the CNTs are Cu plated in order to further improve their thermal conductivity, the CNTs could be made to have more affinity to a silicon-containing substance while simultaneously being made more hydrophilic for purposes of plating liquid permeation. In such cases, two kinds of affinity could potentially be achieved simultaneously by mixing oxygen, or an amine or other substance vapor (or mist) capable of conferring hydrophilicity at a suitable ratio with the silicon-containing substance vapor (or mist or the like).

The various definitions, attributes and preferred embodiments used to explain the surface modified CNT material in the aforementioned embodiments of the present invention can also be applied to other embodiments of the present invention to the extent that they do not violate the intent of the present invention.

EXAMPLES

Examples and Comparative Examples are explained next.

Example 1

Using as the substrate an Si wafer (p-type (100)) with 25 nm of Ni formed thereon by sputtering, multi-wall CNTs were grown to about 3 μm at 650° C. by thermal CVD using acetylene gas as the raw material. When measured, the surface density of the nanotubes was about $5 \times 10^{11}/cm^2$.

This sample was first baked for 5 minutes at 400° C. in clean air to remove combustible impurities other than nanotubes from the nanotube surfaces and was then transferred immediately to a processing unit in which tetramethylsilane $(Si(CH_3)_4)$ as a specific substance was used as a gas diluted with pure nitrogen to a vapor pressure of 1 atmosphere and a concentration of about 5 vol %. The gas flow rate was 1 L/minute.

This was then exposed for 2 minutes to VUV using an excimer UV lamp with an output of 30 mW/cm² to generate Xe excimer UV (central wavelength λ=172 nm). The structure of the unit was as in FIG. 2.

The XPS and IR spectra of this sample were analyzed before and after this treatment, and formation of silicon-carbon bonds not present in the nanotubes before the treatment was confirmed after the treatment.

When the same processes were performed but without VUV exposure, no silicon-carbon bonds were found after processing.

Example 2

Using the same specific substance as in Example 1, and single-walled CNTs were produced by arc discharge on an Si wafer (p-type (100)) as the sample.

This was processed as in Example 1, except that the processing time was 20% of that in Example 1.

The XPS and IR spectra of this sample were analyzed before and after this treatment, and formation of silicon-carbon bonds not present in the nanotubes before the treatment was confirmed after the treatment.

When the same processes were performed but without VUV exposure, no silicon-carbon bonds were found after processing.

Example 3

A cylindrical hole pattern 0.5 μm in diameter and 1 μm deep was formed on an Si substrate, a 10 nm Ti thin film was formed by sputtering on the entire surface of the wafer including the bottoms of the hole pattern, Ni fine particles with an average particle size of 10 nm were scattered across the entire surface of the wafer including the bottoms of the hole pattern, and multi-walled CNTs 1500 nm in length were grown by thermal CVD up to the tops of the holes. The surface density of the nanotubes was measured as about $3\times10^{11}/cm^2$.

In use of the same unit as in Example 1, this sample was exposed to VUV as in Example 1 using a mixed gas of hexamethyldisilazane as a specific substance diluted with nitrogen at a volume ratio of 1%. The VUV exposure time was 200% of that in Example 1.

After processing, a 5% acetone solution of γ-aminopropylethoxysilane [$H_2N(CH_2)_3Si$ $(OCH_2CH_3)_3$] (hereunder abbreviated as APES) was dripped onto the sample, which after a while was dried thoroughly with a hot plate, and when the cross-section of the holes were observed by scanning electron microscopy (SEM), the nanotubes were confirmed to be partially bundled in the holes. This is thought to show what was the effect of permeation by the APES solution. That is, it is considered that because of the good wettability by the APES solution, the APES solution wetted the nanotube surfaces, and the nanotubes were bound together by the APES solution into bundles that remained after the APES solution had evaporated. In this example, the electrical resistance between the upper surface and lower surface (substrate surfaces) of the CNTs bundled by the APES solution was a very low 1.5Ω (ohms).

By contrast, when an unprocessed nanotube sample in a hole pattern was processed in the same way, there was very little change after processing, and little bundling of the nanotubes, which were found to be standing largely independently. That is, it was thought that because the unprocessed nanotubes had poor wettability by the APES solution, the APES solution was repulsed from the nanotube surfaces, with the result that the nanotubes were not bound into bundles by the APES solution.

When nanotubes were cut off from processed and unprocessed samples and the XPS and IR spectra were analyzed, silicon-carbon bonds not seen in the nanotubes before processing were confirmed to have formed after processing.

When TEOS (tetraethoxysilane, $Si(OC_2H_5)_4$) was deposited by CVD in place of the aforementioned APES solution treatment, and the sample was observed by SEM, the TEOS was found to have filled the gaps well between the grown nanotubes. When unprocessed nanotubes in a hole pattern were processed in the same way and the cross-sections of the holes were observed by SEM, however, the TEOS had not filled in the gaps between the grown nanotubes, and many cavities still remained.

From these results, it appears that these nanotubes have improved wettability by the APES solution, indicating good affinity to solvents, adhesives and other substances having silicon-containing groups. While TEOS, SOG and Low-k resins are suitable materials for filling in the gaps between nanotubes grown on a substrate for example, still greater effects can be obtained by improving the interfacial affinity to the nanotubes according to some embodiments.

Example 4

A 10 nm Ti thin film was formed by sputtering on the entire wafer surface of an Si substrate, after which Ni fine particles with an average particle size of 10 nm were scattered across the entire wafer surface, and a 2 μm×5 μm rectangular pattern was formed by optical lithography using a resist and developed, leaving the Ni fine particles in a 2 μm×5 μm rectangular pattern.

Multi-walled CNTs 1500 nm in length were then grown thereon by thermal CVD to form a cubic structure of nanotubes. When measured, the surface density of the nanotubes was about $2\times10^{11}/cm^2$.

Using a unit similar to that of Example 1, this sample was exposed to VUV as in Example 1 using a mixed gas of a specific substance tetramethylsilane $(Si(CH_3)_4)$ diluted with nitrogen at a volume ratio of 1%. The VUV exposure time was 300% of that in Example 1, however.

A solution of SOG (spin on glass) diluted with a 1:1 (volume ratio) mixed solution of ethanol and MIBK (methyl isobutyl ketone) was then dripped on this processed sample, rapidly spin coated, and then thoroughly dried with a hot plate at 150° C. and then at 300° C., for 10 minutes respectively.

When this was observed by scanning electron microscopy (SEM), the cubic structure of the nanotubes was partially bundled, and SOG had permeated between most of the nanotubes.

By contrast, when an unprocessed nanotube sample of the same structure was treated in the same way, the nanotubes were found to be standing independently with almost no bundling, and with the SOG covering them. That is, it is thought because the unprocessed nanotubes had poor wettability by the SOG solution, the spaces between the nanotubes were not filled in by the SOG solution.

Example 5

A 10 nm Ti thin film was formed by sputtering on the entire wafer surface of an Si substrate, after which Ni fine particles with an average particle size of 10 nm were scattered across the entire wafer surface, and a 2 μm×5 μm rectangular pattern was formed by optical lithography using a resist and developed, leaving the Ni fine particles in a 2 μm×5 μm rectangular pattern.

Multi-walled CNTs 1500 nm in length were then grown thereon by thermal CVD to form a cubic structure of nanotubes. When measured, the surface density of the nanotubes was about $2\times10^{11}/cm^2$.

Using a unit similar to that used in Example 1, this sample was exposed to VUV as in Example 1 using a mixed gas of a specific substance tetramethylsilane ($Si(CH_3)_4$) and triethylamine diluted with nitrogen to volume ratios of 1% and 0.3%, respectively. The VUV exposure time was 400% of that in Example 1, however.

When the surface of this processed sample was analyzed by FT-IR and XPS, silicon-carbon bonds and nitrogen-carbon bonds were seen.

This processed sample was then treated as follows.

When CNTs of this processed sample were plated by being immersed in an aqueous Cu electroless plating solution, the Cu adhered around the CNTs.

A solution of SOG (spin on glass) diluted with a 1:1 (volume ratio) mixed solution of ethanol and MIBK (methyl isobutyl ketone) was then dripped on this processed sample, immediately spin coated and dried with a hot plate at 150° C. and then at 300° C., for 10 minutes respectively. As a result, a sample was obtained having a rectangular pattern of CNT and Cu on an Si substrate, embedded in SOG above and around the CNTS.

This processed sample was then CMP treated so that the pattern of CNT and Cu showed out of the SOG. This wafer sample can be used effectively as a heat diffusion "member" ("heat spreader") of an LSI.

The same test was also performed without the processing of the present invention.

That is, a 10 nm Ti thin film was formed by sputtering on the entire wafer surface of an Si substrate, after which Ni fine particles with an average particle size of 10 nm were scattered across the entire wafer surface, and a 2 μm×5 μm rectangular pattern was formed by optical lithography using a resist and developed, leaving the Ni fine particles in a 2 μm×5 μm rectangular pattern. 1500 nm-long multi-wall CNTs were then grown thereon by thermal CVD to form a cubic structure of nanotubes. When measured, the surface density of the nanotubes was about $2\times10^{11}/cm^2$.

When the surface of the sample after processing was subjected to FT-IR and XPS analysis, there were found to be no silicon-carbon bonds or nitrogen-carbon bonds.

This processed sample was then treated as follows.

When CNTs of this processed sample were plated by being immersed in an aqueous Cu electroless plating solution, the CNTs were not sufficiently wetted by the plating solution, and the Cu did not adhere around the CNTs.

A solution of SOG (spin on glass) diluted with a 1:1 (volume ratio) mixed solution of ethanol and MIBK (methyl isobutyl ketone) was then dripped on this processed sample, immediately spin coated and dried with a hot plate at 150° C. and then at 300° C., for 10 minutes respectively.

When this processed sample was then CMP treated, "peeling" occurred at the boundaries between the SOG and CNTs because there was not sufficient close contact between the two, and a sample with a good pattern could not be prepared.

Example 6

A 10 nm Ti thin film was formed by sputtering on the entire wafer surface including the bottom faces of an Si substrate, and Ni fine particles with an average particle diameter of 10 nm were then scattered across the entire wafer surface.

Multi-wall CNTs 1500 nm in length were then prepared by thermal CVD using the same methods as in Example 4.

Using a unit similar to that used in Example 1, this sample was exposed to VUV as in Example 1 using as the specific substance a mixed gas of tetramethylsilane ($Si(CH_3)_4$) and oxygen diluted with nitrogen to volume ratios of 1% and 0.1%, respectively. The VUV exposure time was 400% of that in Example 1, however.

CNTs shaved off from this Si substrate (1/10000 wt %) were mixed with a liquid comprising 1/100 wt % AIBM (azobisisobutyronitrile) mixed with styrene monomer, and this was carefully scattered in a thin layer on a PET (polyethylene terephthalate) film.

This was treated for 15 minutes at 65° C. in a nitrogen atmosphere, and peeled off the PET film to prepare an electrically conductive pressure-sensitive adhesive sheet. By superimposing and pressing two such sheets, it was possible to prepare a hard and uniform electrically conductive sheet.

When a tetramethylsilane ($Si(CH_3)_4$) mix gas which was the same as the previously used one except that tetramethylsilane was diluted by itself in nitrogen without the oxygen, was used, the sample had cracks after being peeled from the PET film, and it was not possible to form a uniform sheet.

What is claimed is:

1. A method for manufacturing a surface modified carbon nanotube material, the method comprising a combination of exposing the carbon nanotube material to ultraviolet rays and supplying a silicon-containing compound to the carbon nanotube material,
wherein the ultraviolet rays include only a wavelength component in the range of 10 to 200 nms, and does not include a wavelength component in the range longer than 200 nms.

2. The method according to claim 1, wherein the surface of the surface modified carbon nanotube material is modified with at least one of a silicon-containing group and a silicon-containing compound.

3. The method according to claim 1, wherein the silicon-containing compound is a substance capable of generating chemically active species when activated by ultraviolet rays.

4. The method according to claim 1, wherein the carbon nanotube material, the surface of which is to be modified has been prepared by CVD.

5. The method according to claim 1, wherein the carbon nanotube material, the surface of which is to be modified has been grown on a substrate.

6. The method according to claim 1, wherein the surface modified carbon nanotube material has better wettability when in contact with a silicon-containing substance than before the modification.

7. The method according to claim 1, wherein the surface modified carbon nanotube material has better wettability than before the modification when in contact with at least one selected from the group consisting of the electrically conductive substances, insulating substances, hydrophilic substances, lipophilic substances, and substances having specific groups.

8. The method according to claim 1, wherein silicon atoms are present on the surface of the surface modified carbon nanotube material.

9. The method according to claim 8, wherein silicon-carbon bonds are present on the surface of the surface modified carbon nanotube material.

10. The method according to claim 3, wherein the chemically active species comprise at least either an electron donating group radical or electron attractive group radical.

11. The method according to claim 1, wherein the silicon containing compound is diluted with an inactive substance that does not modify the surface of the carbon nanotube material even when exposed to the ultraviolet rays.

12. The method according to claim 1, wherein the silicon-containing compound is supplied together with at least one substance selected from the group consisting of hydrocarbons, oxygen, amines, alkyl halides, alcohols, ethers and mixtures thereof.

13. The method according to claim 1, wherein said silicon-containing compound is supplied to the carbon nanotube material in a gaseous phase.

* * * * *